United States Patent [19]

Eisenhart

[11] Patent Number: 5,013,933
[45] Date of Patent: May 7, 1991

[54] BIAS CIRCUIT FOR SOLID STATE DEVICES

[75] Inventor: Robert L. Eisenhart, Woodland Hills, Calif.

[73] Assignee: Hughes Aircraft Company, Los Angeles, Calif.

[21] Appl. No.: 809,638

[22] Filed: Dec. 16, 1985

[51] Int. Cl.[5] .................. H03K 3/01; H03K 3/313; H03B 5/12

[52] U.S. Cl. .................. 307/296.1; 307/296.3; 307/296.6; 307/317.1; 331/107 R

[58] Field of Search .................. 307/296 R, 318, 319, 307/322, 317 R, 310, 297; 331/107 R, 107 T, 107 DP, 107 SL, 107 C

[56] References Cited

U.S. PATENT DOCUMENTS

| | | | |
|---|---|---|---|
| 2,867,695 | 1/1959 | Buie | 307/297 |
| 3,051,847 | 8/1962 | Niemeyer | 307/310 |
| 3,083,319 | 3/1963 | Tiemann | 307/310 |
| 3,112,454 | 11/1963 | Steinhoff | 307/322 |
| 3,127,574 | 3/1964 | Sommers, Jr. | 331/107 T |
| 3,249,880 | 5/1966 | Sante | 307/310 |
| 3,987,318 | 10/1976 | Meijer | 307/310 |
| 4,482,871 | 11/1984 | Stringfellow | 331/101 |

OTHER PUBLICATIONS

Carlson et al., "The Physics and Applications of Microwave Diodes", Extracted from the Varian Associates Application Note on Impatt Diodes, pp. 7-5.
"Operating Voltage Power Supply Considerations Output Power", Extracted from the Varian Associates Application Note on Avalanche Diode (IMATT) Oscillators, vol. 7, #1, Oct. 1969.
NEC IMPATT CW Application Note, AN 79701, p. 12.
"Microwave Power Generation and Amplification Using Impatt Diodes", Extracted from Hewlett Packard Application Note #935, p. 8.
McGraw-Hill Encyclopedia of Science and Technology, 1960, p. 74.
D. K. Roy, "Tunnelling and Negative Assistance Phenomena in Semiconductor", 1977, p. 138.
T. Misawa, "Microwave Si Avalanche Diode with Nearly-Abrupt-Type Junction", IEEE Transaction on Electron Devices, vol. ED-14, No. 9, Sep. 1967.
S. Sze, *Physics of Semiconductor Devices* (1969), pp. 150-258.
*McGraw-Hill Encyclopedia of Science and Technology* (1971), vol. 5, p. 74.

Primary Examiner—Stanley D. Miller
Assistant Examiner—Trong Phan
Attorney, Agent, or Firm—R. M. Heald; C. D. Brown; W. K. Denson-Low

[57] ABSTRACT

A loadline bias circuit for biasing solid state devices operable at high frequencies is disclosed. The source impedance of the dc bias circuit is adjusted to influence the RF device characteristic, thereby creating a way to optimize the device performance. The bias circuit comprises a resistive element coupled in series connection with a constant voltage source or in parallel connection with a constant current source. The bias circuit may be adapted to set an optimum relationship between the bias current and bias voltage so that when one bias parameter changes, the other will automatically compensate with an appropriate change as well. The resistive element provides a device operating range throughout which the bias power supplied to the device is substantially constant. The value of the loadline, that is, the resistive element, can be selected to optimize particular performance parameters.

5 Claims, 9 Drawing Sheets

BIAS CIRCUIT FOR SOLID STATE DEVICES

BACKGROUND OF THE INVENTION

The present invention relates to high frequency solid state devices, and more particularly to biasing techniques for solid state power devices, for example, IMPATT diodes employed in RF circuits.

Power is supplied to solid state power devices generally in the form of a direct current or voltage through what is commonly referred to as the bias circuit. The dc bias circuit provides the energy that is converted from dc to RF by the solid state device, typically an IMPATT diode. The converted energy is coupled to a load through an RF circuit.

The common practice has been to bias IMPATT diodes with a constant current (CC) bias, i.e., a bias circuit adapted to supply a constant current to the device, even as the device voltage varies in operation. Such variations may be due, for example, to changes in temperature, RF circuit impedance, frequency or power of the RF input signal. Since the current is held constant, there is no adjustment in the bias to compensate for the changes in voltage. If the circuit performance was originally optimized for one condition, it would be degraded with the change in voltage. U.S. Pat. Nos. 4,359,700 and 4,328,470 are understood to disclose examples of constant current bias circuits.

The IMPATT device with a CC bias is generally operated as an injection-locked oscillator, whose performance is typified by high stage gain and narrow bandwidth. Bandwidths of IMPATT diode circuits for X band operation have generally not exceeded 1%.

The reference "Linear High Power IMPATT Amplifiers Using Constant Voltage Bias," J. W. McClymonds, G. C. Dalman and C. A. Lee, Proceedings of the Seventh Biennial Cornell Device Conference, pp. 349-359 (1979) discusses the use of constant voltage (CV) biasing as a way to improve the linear gain of IMPATT circuits. The change from CC to CV biasing results in correspondingly different RF circuit performance. The studies at Cornell University are believed to have demonstrated IMPATT operation with bandwidths of 20% or more using a low gain (3 to 4 db) reflection amplifier with CV biasing.

Thus, until very recently, IMPATT amplifiers have been biased using CC power supplies as were conventionally used with oscillators. In addition to performance improvements resulting from CV biasing of IMPATT amplifiers, the relative simplicity of CV pulser design over CC circuits may result in a considerable cost, weight and volume advantage over conventional CC pulsers. To achieve high combining efficiencies, however, IMPATT radar transmitters usually demand gains of 10 db or better, necessitating the use of injection-locked oscillators rather than lower gain amplifiers.

The CC and CV bias circuits can be characterized as direct bias compensation techniques with respective infinite and zero impedances for the bias circuit. These two known biasing techniques are illustrated by the conceptual bias circuits of FIG. 1(a), a CC bias circuit, and FIG. 1(b), a CV circuit. FIG. 2 plots the bias voltage $V_B$ applied to the diode against the bias current $I_B$. The diode device lines 1 and 2 represent the IV characteristics of the IMPATT diode for two distinct operating temperatures. The intersection of the constant current line CC and device line 1 denotes an initial device operating point P1, indicating the initial bias voltage and current for the diode. For a device biased by a CV bias circuit, the line "CV" in FIG. 2 denotes the voltage level supplied by the bias circuit for the same initial operating point P1.

If for some reason, for example, with an increase in temperature, the IMPATT device line shifts to the device line 2, the new operating points for the CC and CV bias circuits would not be coincident, representing quite different device performance. The new CC operating point P2 is at a higher voltage than before, resulting in an increase in bias circuit power and, concomitantly, output power. Thus, use of CC biasing requires that the bias circuit be adapted to provide protection against thermal runaway, resulting in sacrifice of some available output power. This margin is provided by operating at somewhat less than the maximum available power. The new CV operating point P3, on the other hand, is at a lower current, resulting in a reduction in bias circuit power and operating power.

IMPATT diodes are often employed in RF combiner circuits to increase the available output power as, for example, described in U.S. Pat. No. 4,359,700. Generally, it is desirable to have the individual diode circuits in a combiner operate with substantially the same performance to maximize the output performance of the combiner circuit. Another drawback of CC or CV bias circuits is readily apparent from FIG. 2 if operating lines 1 and 2 are understood to represent two different IMPATT diodes. With the CC and CV bias circuits, two IMPATT diodes will have substantially different operating performance (power and frequency).

Moreover, the frequency, output power and functional bandwidth tend to shift as the temperature changes. For a CC biased RF combiner circuit, as the temperature increases, the output frequency is lowered and the average output power increases. These effects may result in a combiner circuit which fails to provide a required minimum power output at any one frequency in the combiner frequency bandwidth over the possible temperature range.

Another drawback of the CC bias circuit is that diode cold-start performance suffers from a slow heating effect, caused by the lower bias circuit power at lower temperatures.

It is known in the art to provide bias current compensation for IMPATT diodes using feedback circuits employing active devices, for example, U.S. Pat. No. 4,328,470. The desired goal of such feedback circuits is to provide bias circuit compensation as the operating characteristics of the device change. These feedback circuits suffer from decreased reliability resulting from the use of active devices, and are more complex and accordingly more expensive.

It is therefore an object of the present invention to provide a solid state device bias circuit adapted to increase the bandwidth of RF circuits in which the device is employed.

Another object of the invention is to provide a solid state device bias circuit adapted to result in increased circuit gain.

Yet another object of the invention is to provide a bias circuit for solid state devices which results in substantially linear gain over the circuit bandwidth.

A further object of the invention is to provide a bias circuit for solid state devices which is simplified and of greater reliability than prior art bias circuits.

Other objects of the invention are to provide a bias circuit for solid state RF devices which results in increased output power, reduced temperature sensitivity, elimination of thermal runaway and faster turn-on (cold start) characteristics.

SUMMARY OF THE INVENTION

A direct compensation bias circuit is disclosed for loadline biasing of solid state devices. The bias circuit is adapted to provide a substantially constant bias power to the device and comprises generally a constant power source and a passive means for establishing a finite, constant bias circuit impedance. The preferred embodiment comprises a resistive element in series connection with a voltage source, or alternatively in parallel connection with a current source. The loadline bias circuit allows the selection of an optimum relationship between the bias current and voltage so that when one parameter changes, the other parameter will automatically compensate with an appropriate change. Further, the value of the loadline can be selected in dependence upon the particular performance parameter being optimized.

Other features and improvements are disclosed.

BRIEF DESCRIPTION OF THE DRAWINGS

These and other features, objects and advantages of the invention will be more fully apparent from the detailed description set forth below taken in conjunction with the drawings in which like reference characters identify corresponding parts throughout and wherein.

DETAILED DESCRIPTION OF THE PREFERRED EMBODIMENTS

The present invention comprises a novel bias circuit for solid state RF devices. The following description of the preferred embodiment of the invention is provided to enable a person skilled in the art to make and use the invention. Various modifications to these embodiments may be apparent to those skilled in the art, and the generic principles defined herein may be applied to other embodiments.

Figure 1A:
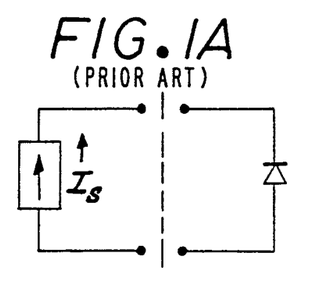
FIGS. 1(a) and 1(b) are conceptual circuit schematics of the respective prior art constant current and constant voltage bias circuits.
Figure 1B:
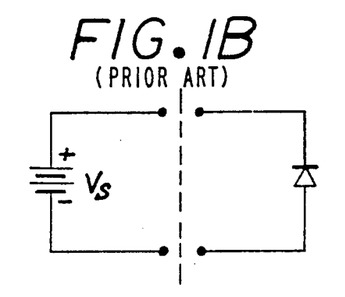
Figure 2:
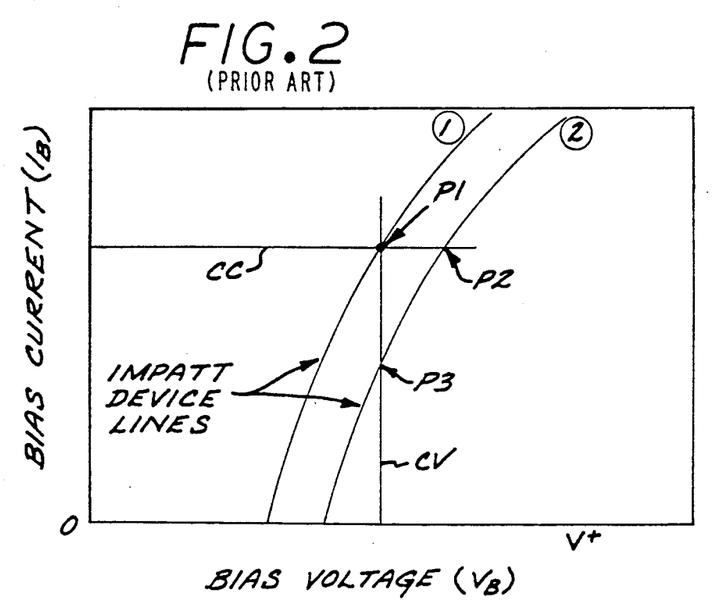
FIG. 2 is a graph plotting the bias current and bias voltage, illustrating the respective prior art constant current and voltage techniques.
Figure 3A:
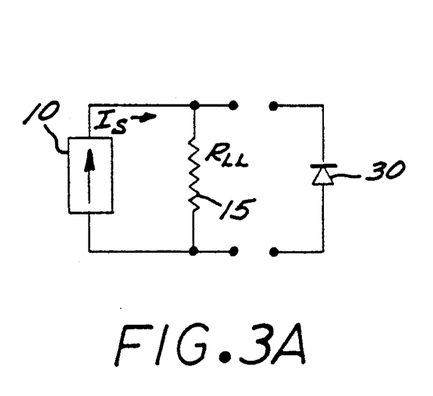
FIGS. 3(a) and 3(b) are conceptual equivalent circuits of the loadline bias circuit of the present invention.
Figure 3B:
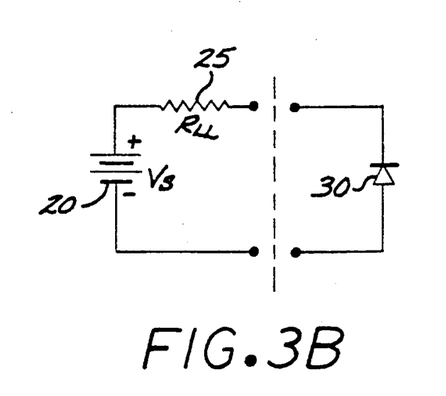

In contrast to the constant current bias circuit characterized by infinite impedance, illustrated in FIG. 1(a), and the constant voltage circuit characterized by zero impedance and illustrated in FIG. 1(b), a loadline bias circuit embodying the present invention is characterized by a fixed intermediate impedance between the extreme values of zero and infinity. FIGS. 3(a) and 3(b) represent equivalent bias circuits embodying the loadline bias technique of the present invention. The circuit of FIG. 3(a) comprises a constant current source 10 for providing a source current $I_S$, with resistor 15 disposed in parallel connection with the constant current source. The circuit of FIG. 3(b) comprises a constant voltage source 20 for providing a source voltage $V_S$, in series connection with resistor 25. The solid state device 30 may then be coupled to the output terminals of the bias circuits of FIG. 3(a) or 3(b).

For the equivalent circuit of FIG. 3(a), the effective impedance of the bias circuit is determined by the value of the shunt resistive element 15, since the current source 10 has an (ideal) infinite impedance. Similarly, for the equivalent circuit of FIG. 3(b), the effective impedance of the bias circuit is determined by the value of resistor 25, since the constant voltage source 20 has an effective (ideal) zero impedance.

Figure 4:
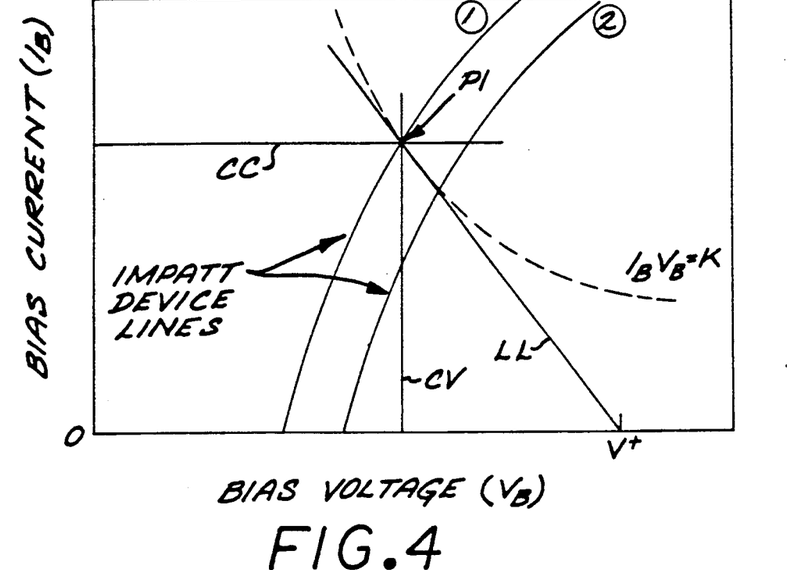
FIG. 4 is a graph plotting bias current and voltage for the loadline bias circuit, as well as the prior art constant current and constant voltage circuits.

Referring now to FIG. 4, bias current and voltage are plotted, illustrating not only the known CC and CV bias conditions, but loadline biasing in accordance with the invention. The loadline LL establishes the initial operating point at its intersection with device line 1. If the device line shifts to the position of device line 2, loadline bias circuit operation shifts along the loadline LL to follow approximately the $I_B V_B = K$ (constant) curve illustrated in FIG. 4. This shift results in a drop in bias current and a corresponding increase in voltage, with the ratio selected so that the consequent device output power remains substantially constant over a limited operating range about the initial operating point.

This may be appreciated by analyzing the circuit relationships. For the loadline circuit illustrated in FIG.

3(a), the relationships for the bias current $I_B$ and bias voltage are given by Equations 1 and 2.

$$I_B = I_S - V_B/R_{LL} \quad (1)$$

$$V_B = R_{LL}(I_S - I_B) \quad (2)$$

Equations 3 and 4 describe the relationships for the bias current and voltage for the loadline bias circuit of FIG. 3(b).

$$I_B = V_S - V_B/R_{LL} \quad (3)$$

$$V_B = V_S - I_B R_{LL} \quad (4)$$

For the current source embodiment shown in FIG. 3(a), the shunt resistor causes the voltage across the diode to increase as the current through the diode decreases. Similarly, for the voltage source embodiment shown in FIG. 3(b), the series resistor causes the current through the diode to increase as the voltage across the diode is reduced.

It will be understood by those skilled in the art that the characteristics of the IMPATT diode determine the initial device operating point. The CC, CV or loadline bias circuits are each able to bias the diode to this initial operating point. While the CC and CV bias circuits provide increasing or decreasing power to the device as the device line changes, the loadline bias circuit is adapted to compensate for operating characteristic changes and provide the device with substantially constant bias power.

It is noted that the "$I_B V_B = K$" dotted curve shown in FIG. 4 represents a "1"/X relationship, passing through the initial device operating point. The loadline LL illustrated in FIG. 4 is tangential to the "1"/X curve at the initial device operating point. Thus, for limited excursions along the loadline about the initial operating point, the constant slope loadline approximates the "1"/X curve to provide substantially constant bias power to the device. Depending upon the loadline value selected in accordance with optimization of a particular circuit parameter, the actual loadline may not be tangential to the equal power curve for particular applications.

Figure 5A:
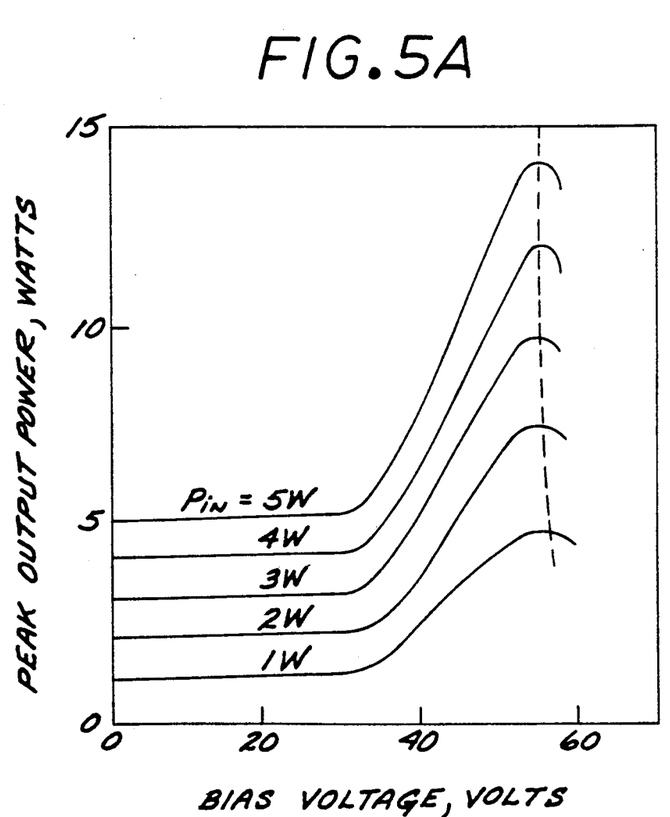
FIG. 5(a) and 5(b) are graphs plotting the peak output power as a function respectively of bias voltage for a constant voltage bias circuit, and bias current for a constant current bias circuit, each for a family of input RF power levels.

The value of the loadline can be selected in dependence upon the particular performance parameter being optimized, for example, gain, bandwidth, linearity, efficiency or power. The optimization for high gain operation may be illustrated by examining the operation of a CW reflection amplifier. FIG. 5(a) is a graph plotting output power versus bias voltage for a family of input powers indicated by the various curves. Maximum gain and output power occur when the diode is biased on the peaks of these curves.

Figure 5B:
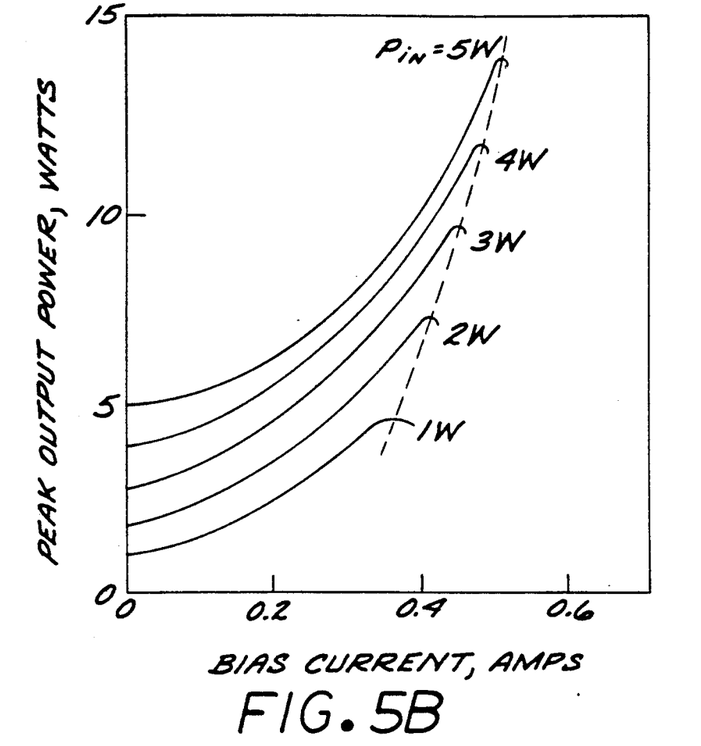
Figure 5C:
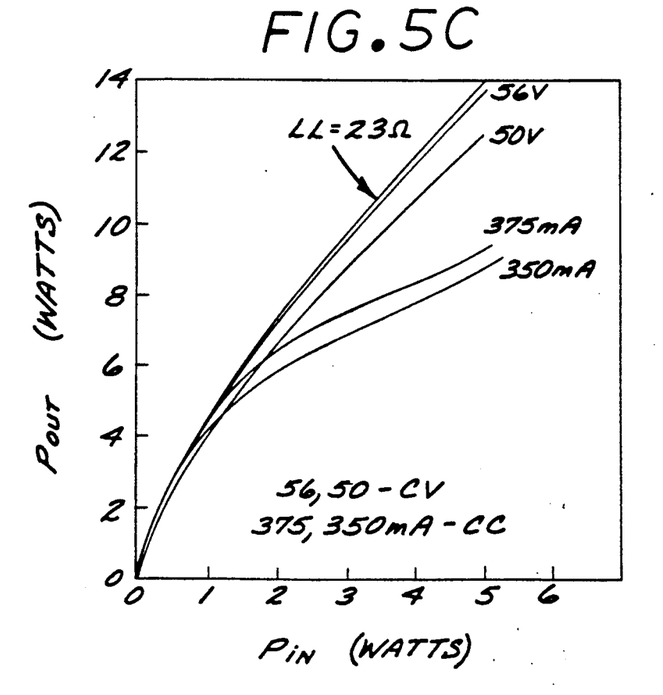
FIG. 5(c) is a graph illustrating the measured improvement resulting from loadline biasing in comparison to CV and CC performance at typical bias voltage and current values.

A plot of output power versus bias current for a family of input powers is shown in FIG. 5(b). In FIG. 5(b), it is apparent that CC biasing would not keep the diode biased on the peaks of the curves as well as CV biasing (see FIG. 5(a)). If the voltages and the currents at which the peaks occur for each particular input power are plotted, the result defines the loadline value for optimum gain and power and is 23 ohms for the diode/-circuit operation illustrated in FIGS. 5(a)-(b). FIG. 5(c) illustrates the measured improvement resulting from the 23 ohm loadline biasing in comparison to CV and CC performance at typical bias voltage and current values. The output power performance resulting from loadline biasing is slightly better than CV biasing and considerably better than conventional CC biasing.

Optimization of the bandwidth parameter may be illustrated by a pulsed oscillator operating in a coaxial microwave circuit. When considering circuit operation over a frequency band, it is noted that the efficiency, and hence the power dissipation and temperature, vary over the band. For this reason, the optimum bias current for maximum gain must also vary. Loadline biasing is a method by which the diode can be biased with a more optimal, varying voltage and current over the entire band of operation.

Figure 6:
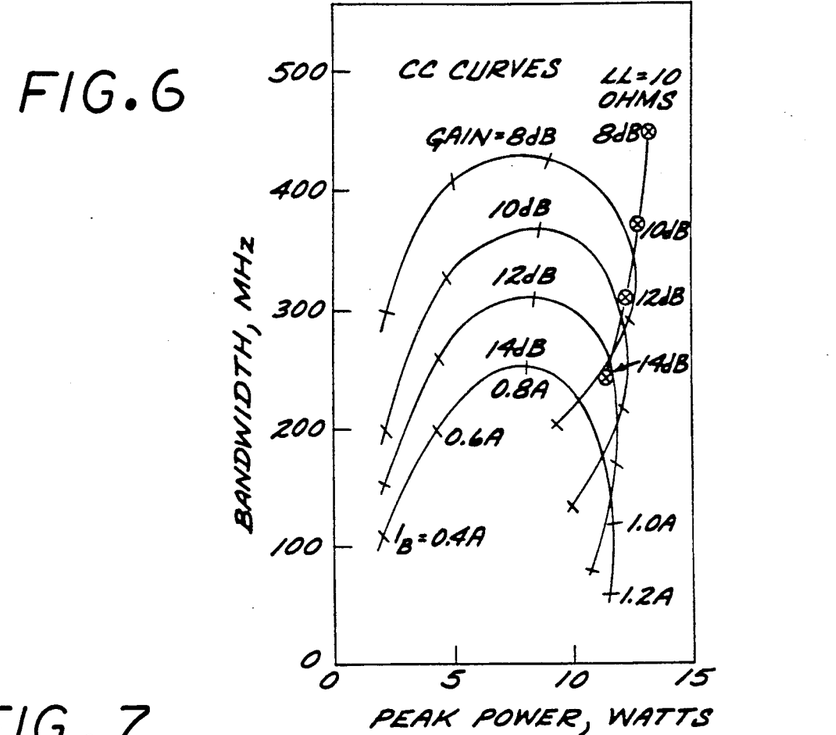
FIG. 6 is a graph plotting circuit bandwidth versus peak power for a family of current and gain values for a constant current bias circuit and a family of operating points at corresponding power levels for the loadline bias circuit.

The gain, bandwidth and power tradeoffs of an injection locked oscillator operating with CC biasing are illustrated in FIG. 6. Each line represents operation at a particular gain level and shows a tradeoff between power and bandwidth as the current is varied between 0.4 and 1.2 amperes. The bandwidth and power increase as the current is increased leading to larger gain-bandwidth products. Eventually there is saturation and performance falls off. The best gain-bandwidth product operation occurs around 0.8A bias current. To get the peak power available from the diode, there is a sacrifice in bandwidth so that a tradeoff must be made.

The performance of an injection locked oscillator operating on several different load lines was measured to find an optimum biasing condition. Optimum operating points for a 10 ohm loadline bias at the same four gain levels illustrated for the CC bias circuit are also shown in FIG. 6. Each point is compared with the corresponding CC curve; in all four cases there is a substantial improvement in performance, essentially realizing the maximum power at the maximum bandwidth of the CC case.

Figure 7:
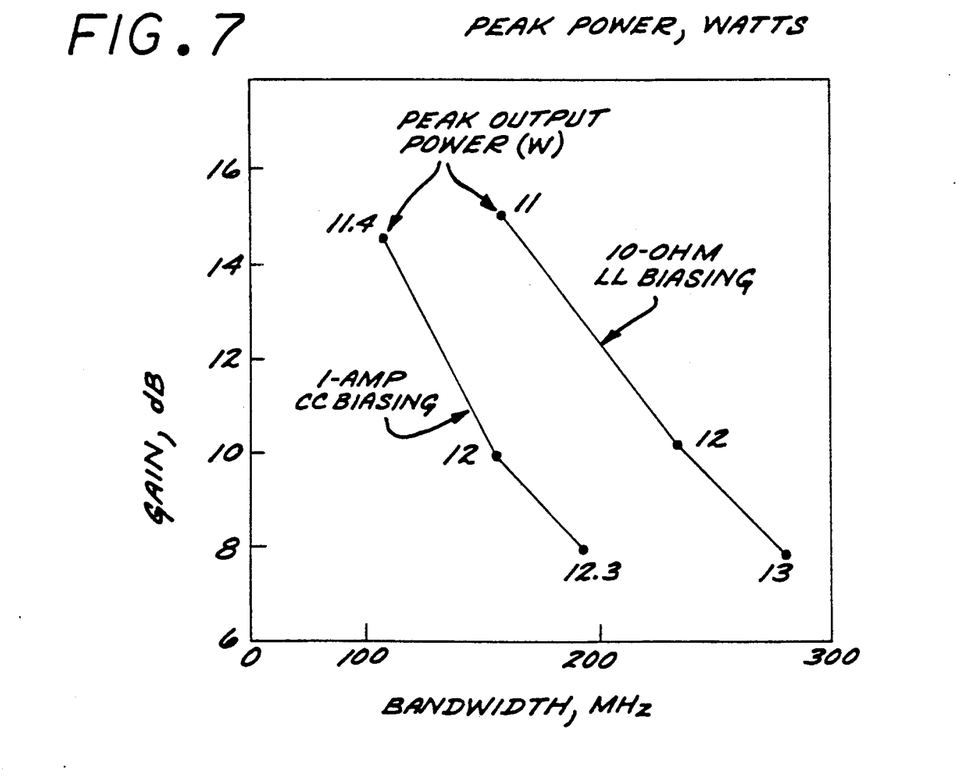
FIG. 7 is a graph plotting circuit gain versus bandwidth for a constant current and loadline bias circuits.

FIG. 7 illustrates a different perspective of this issue, plotting the bandwidth against gain for high power operating conditions with CC (one Ampere) biasing and 10 ohm loadline biasing. FIG. 7 demonstrates that the diode biased optimally on a 10 ohm loadline realizes a much larger gain-bandwidth product.

The optimum loadline for injection locked oscillator operation can be determined at incremental frequencies across the band using the technique described above for CW reflection amplifiers. The optimum loadline impedance tends to be highest at center band and tends to decrease at the band edges. By operating on the optimum loadline for the band edges, the gain in these portions of the band is improved so the 1-dB bandwidth is correspondingly enhanced. If the diode instead was operated on the optimum loadline for center band, then higher gain could be achieved at the center frequency, but the 1-dB bandwidth would be reduced because of the decreased gain at the band edges.

Figure 8:
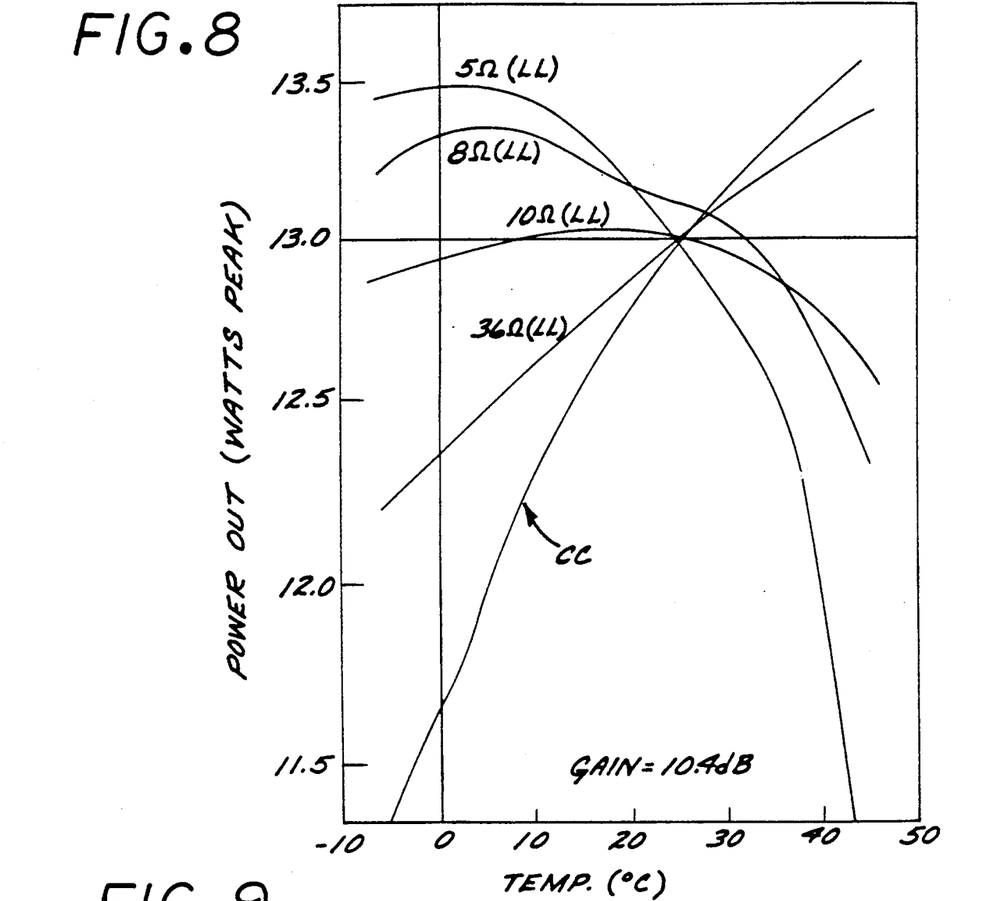
FIG. 8 is a graph illustrating measurements of output power as a function of temperature for several loadline values and one constant current bias circuit.

Referring again to FIG. 4, device lines 1 and 2 may be considered to represent the operating characteristics of two different IMPATT diodes. If both devices are biased with the same loadline bias, substantially the same output power should result. On the other hand, the same level of CC or CV biasing would result in quite different power outputs. This effect is further illustrated in FIG. 8, which plots measurements of output power versus temperature for a single diode, repeated for a variety of loadline values. For CC and high loadline values, the output power increases with temperature. However, for the 10 ohm loadline, the response is quite flat, whereas for very low loadline values the output falls off. The diode would not operate under constant voltage conditions which would represent a very low resistance loadline.

Figure 9:
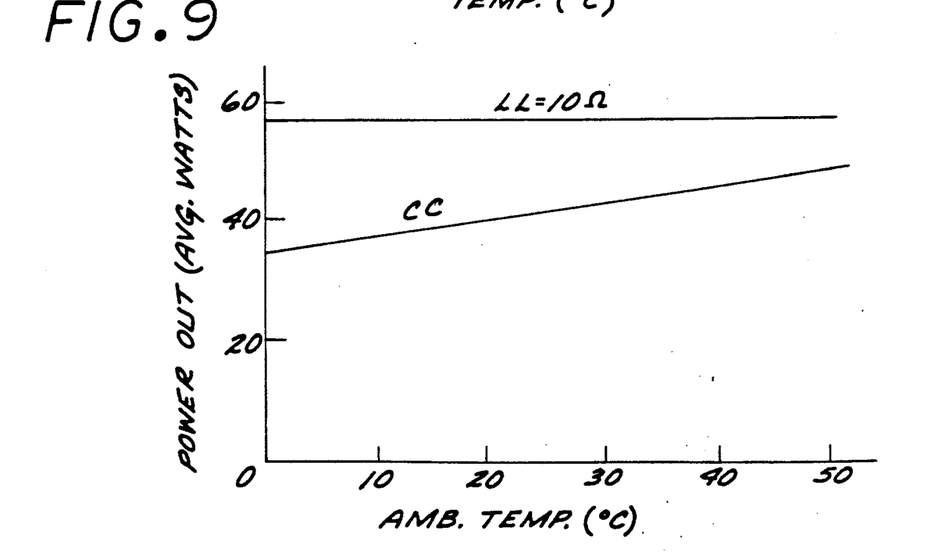
FIG. 9 is a graph which plots the output power as a function of ambient temperature for a 16 diode combiner circuit, for a 10 ohm loadline circuit and a constant current circuit.

The loadline bias technique has also been tested with multiple diode combiner circuits. FIG. 9 plots the output power versus ambient temperature for a 16 diode combiner circuit utilizing Varian "HiLo" Molecular Beam Epitaxy (MBE) diodes. The advantage of loadline biasing is apparent, considering the higher power received for the 10 ohm loadline situation. With CC biasing, the potential for thermal runaway exists, which must be avoided by operating at somewhat less than the maximum available power. This stability threshold is approached as the diode gets hotter. On the other hand, loadline biasing at optimum or lower resistive values is unconditionally stable; the diode can be operated at higher bias levels as required to produce more power.

Figure 10:
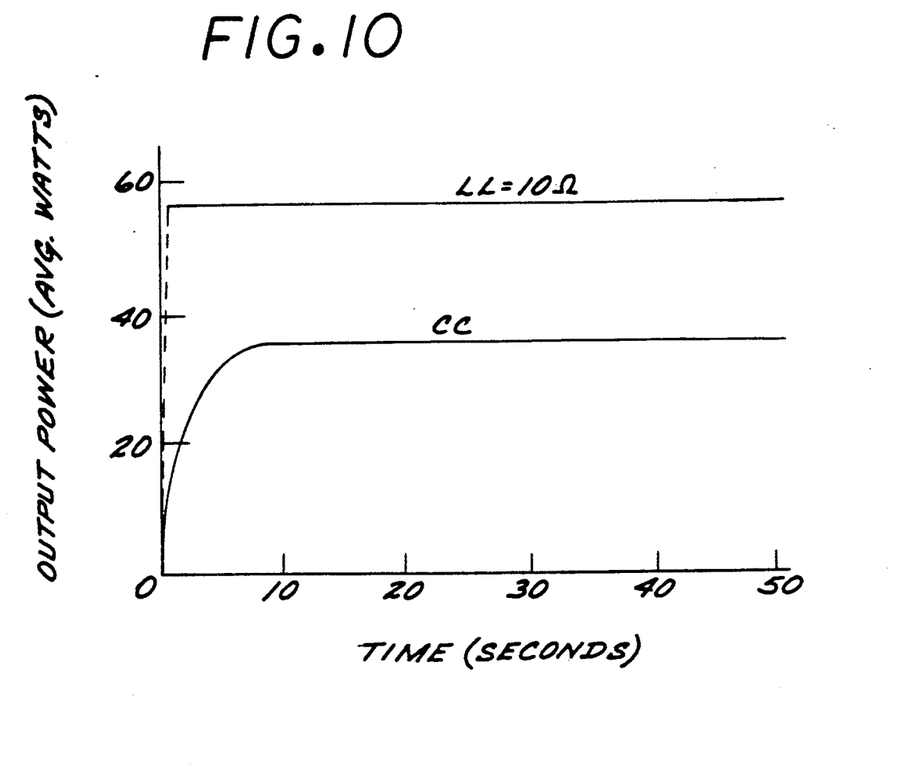
FIG. 10 is a graph illustrating the respective cold-start performances of constant current and 10 ohm loadline bias circuits.

Another temperature-related test performed with 16-diode power combiner demonstrated the relative loadline insensitivity to temperature. Cold-start measurements were made to compare CC and loadline biasing. FIG. 10 illustrates the very fast response with loadline biasing versus the slow heating effect necessary with constant current biasing. CC bias power is lower at cold temperature, resulting in "heating" the device more slowly than with loadline biasing, which provides full bias power immediately.

Figure 11:
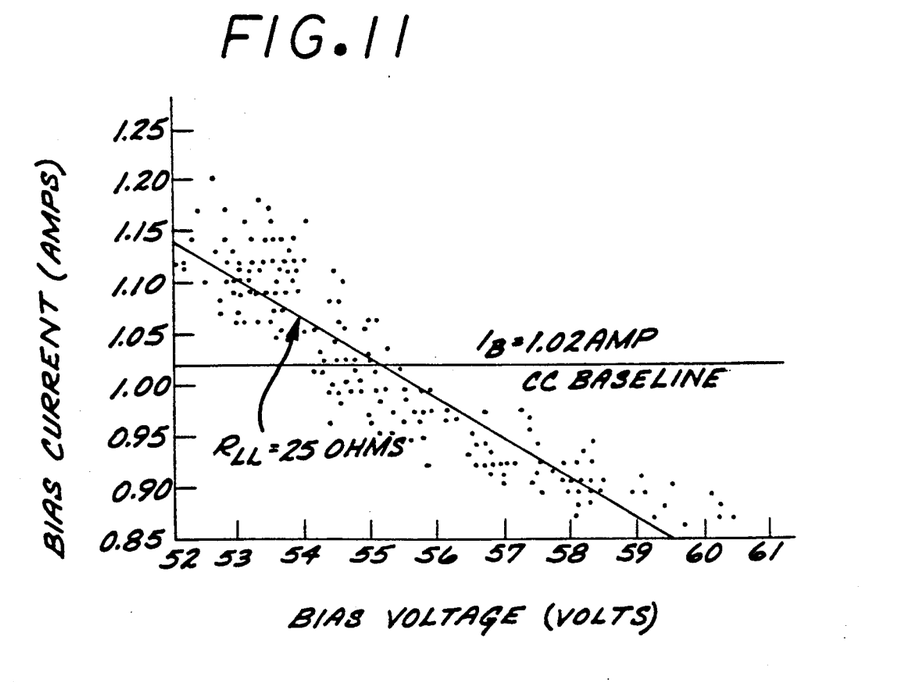
FIG. 11 is a graph plotting the bias current and voltages for a 200 diode set, each operated in the same RF circuit at 9 watts peak power.

Loadline biasing also reduces the performance (power and frequency) variations within a given set of diodes operating under fixed bias conditions. FIG. 11 illustrates this property, plotting the bias current and voltages for about 200 different diodes, all operated in the same RF circuit with a power output of 9 watts peak. The bias was individually adjusted for each diode to establish this 9-watt condition. A definite trend is evident in the data, represented by the linear approximation shown by the line $R_{LL}=25$ ohms.

To achieve the objective to have all of the diodes operating similarly, the conclusion is to use the loadline value represented by the "best fit" straight line, a 25 ohm line. The alternative CC bias circuit operation is illustrated by the horizontal line at 1.02 amperes. Generally, the diodes requiring greater than 1.02 amperes for 9.0 watts peak power will produce less power when forced to operate in a constant current mode, while those diodes not requiring 1.02 amperes for 9.0 watts peak power will produce more power. Therefore, constant current biasing creates a spread in output power that is greater than the spread associated with 25 ohm loadline biasing.

With respect to increasing the bandwidth of a multi-diode combiner circuit, a reduced spread in frequency characteristics for a diode set will directly improve the locking band of a combiner which uses the diode set. Further, the combiner will operate more efficiently, providing more RF power for the same total bias power.

Loadline biasing also provides significant improvements with respect to the biasing electronic circuits. Fewer parts are required per diode channel, the number of supply voltages is reduced by one, and the heat dissipating component is a resistor rather than a transistor. The first two factors help to reduce cost and all three factors contribute to improved reliability.

Mathematical relationships describing the loadline operation have been investigated to establish the fundamental device current/voltage relationship. Equation 5 describes the avalanche breakdown characteristic of an IMPATT diode.

$$I_B = \frac{1}{R_{sc}} (V_B - V_{BDO} - \beta T) \quad (5)$$

The parameters used in Equation 5, et seq. are defined in Table 1.

TABLE 1

| SYMBOL | DESCRIPTION | UNITS |
| --- | --- | --- |
| $I_B$ | Bias Current | Amperes(A) |
| $V_B$ | Bias Voltage | Volts(V) |
| $V^+$ | Source Voltage | V |
| $V_{BDO}$ | Breakdown Voltage at 0° C. | V |
| $\beta$ | Breakdown Voltage/Temp Coef. | V/°C. |
| T | Temperature of Device Junction | °C. |
| $R_{SC}$ | Space Charge Resistance | Ohms |
| $\eta$ | dc to RF Conversion Efficiency | — |
| $\eta$ | Rate of Change of Efficiency with Temperature | °C$^{-1}$ |
| $\theta_D$ | Device Thermal Resistance | °C./W |
| $C_D$ | Device Thermal Capacitance | Ws/°C. |
| $T_A$ | Ambient (Heat Sink) Temperature | °C. |
| $T_{SS}$ | Steady State Temperature | °C. |
| t | Time | Seconds(s) |
| $R_{LL}$ | Loadline Resistance | Ohms |
| $P_{RF}$ | RF Output Power | W |

There is a strong temperature dependence in the last term of Equation 5 which reduces the current for a given voltage. This temperature sensitivity creates a thermal feedback mechanism which may produce an instability.

Heat is generated by the dissipated bias power, as described by Equation 6.

$$T=(1-\eta)\theta_D I_B V_B + T_A \quad (6)$$

This equation shows that the temperature increases for the increasing $I_B V_B$ product, proportionally to the diode thermal resistance. Simply stated, the diode heats up as more bias power is pumped into it. Solving Equations 5 and 6 for the bias voltage $V_B$ results in Equation 7.

$$V_B = (R_{sc}I_B + \beta T_A + V_{BDO})/(1-\theta_D(1-\eta)\beta I_B) \quad (7)$$

Figure 12:
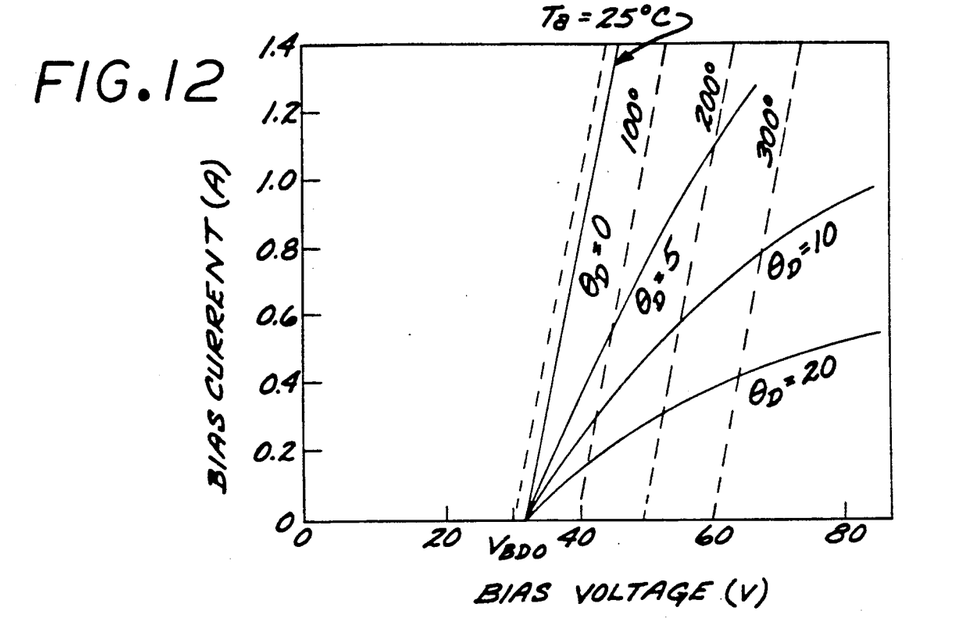
FIG. 12 is a graph plotting the derived diode bias voltage and current for different values of the diode thermal resistance.

Equation 7 describes the fundamental device current/voltage relationship, and is plotted for different values of the thermal resistance $\theta_D$ in FIG. 12. The thermal resistance establishes the slope angle of the $I_B$-$V_B$ characteristic. This effect comes from the increased heating of the device as the thermal resistance increases, since the thermal resistance is the key element in the thermal feedback. The bias voltage $V_B$ described in Equation 7 goes to infinity for a finite value of the bias current $I_B$, representing a voltage runaway condition which may destroy the diode when the current approaches the critical value of Equation 8:

$$I_{B\,(runaway)} = 1/\theta_D(1-\eta)\beta) \quad (8)$$

The constant temperature contours are provided in FIG. 12 to show the variation in temperature, as different operating points may be selected. These curves represent steady state conditions.

The loadline operating point is determined by the intersection of the appropriate device curve shown in FIG. 12 and a bias loadline (refer to FIG. 4). The loadline is defined by Equation 9:

$$V_B = V^+ - I_B R_{LL} \quad (9)$$

Equating the relationship of Equation 7 and 9 results in the relationship of Equation 10, a quadratic in $I_B$, which will provide the operating current.

$$I_B^2 (R_{LL} \beta \theta_D (1-\eta)) - I_B(R_{LL} + R_{SC} + V^+ \beta \theta_D (1-\eta)) \quad (10)$$
$$+ (V^+ - \beta T_A - V_{BDO}) = 0$$

Once the operating bias current is determined, the bias voltage be found using Equation 9.

The optimum loadline value $R_{LL}$ (opt) is normally equal to the bias voltage/current ratio with a modifying factor which is dependent upon device parameters. Since all of the parameters are positive quantities, the factor is less than one. Therefore, the ratio $V_B/I_B$ sets an upper bound on $R_{LL}$, which would be $R_{LL}$ (opt.) for constant efficiency, i.e., when the efficiency temperature derivative is zero ($\eta = 0$). However, the $R_{LL}$ (opt.) is very sensitive to this derivative; a value of only 0.00015 is sufficient to reduce $R_{LL}$ by a factor of 2. It has been found that normally the optimum loadline is from 0.1 to 0.4 of the ratio $V_B/I_B$.

In the above discussion relating to Equations 6-10, a circuit in CW operation was considered. For CW (steady state) operation, the equivalent thermal circuit of the diode consists of a resistor, the thermal resistance. To consider transient CW operation the thermal circuit may be represented as a simple parallel capacitance and (thermal) resistance, with the capacitance representing the heat capacity of the diode junction. Incorporating this equivalent circuit into the loadline biasing equations and solving for temperature as a function of time yields the differential Equation 11.

$$dT/dt + AT^2 + BT + C = 0 \quad (11)$$

The solution is defined by Equation 12

$$T(t) = T_{ss} \left[ \frac{K_1 (1 - (1 - T_A/T_{SS}) e^{-K_2 t}) - T_A}{K_1 - T_A - (T_{SS} - T_A) e^{-K_2 t}} \right] \quad (12)$$

where $T_{SS}$ is the final steady state temperature; $T_A$ is the ambient and starting temperature; and $K_1$ and $K_2$ are constants dependant upon device and circuit parameters.

Figure 13:
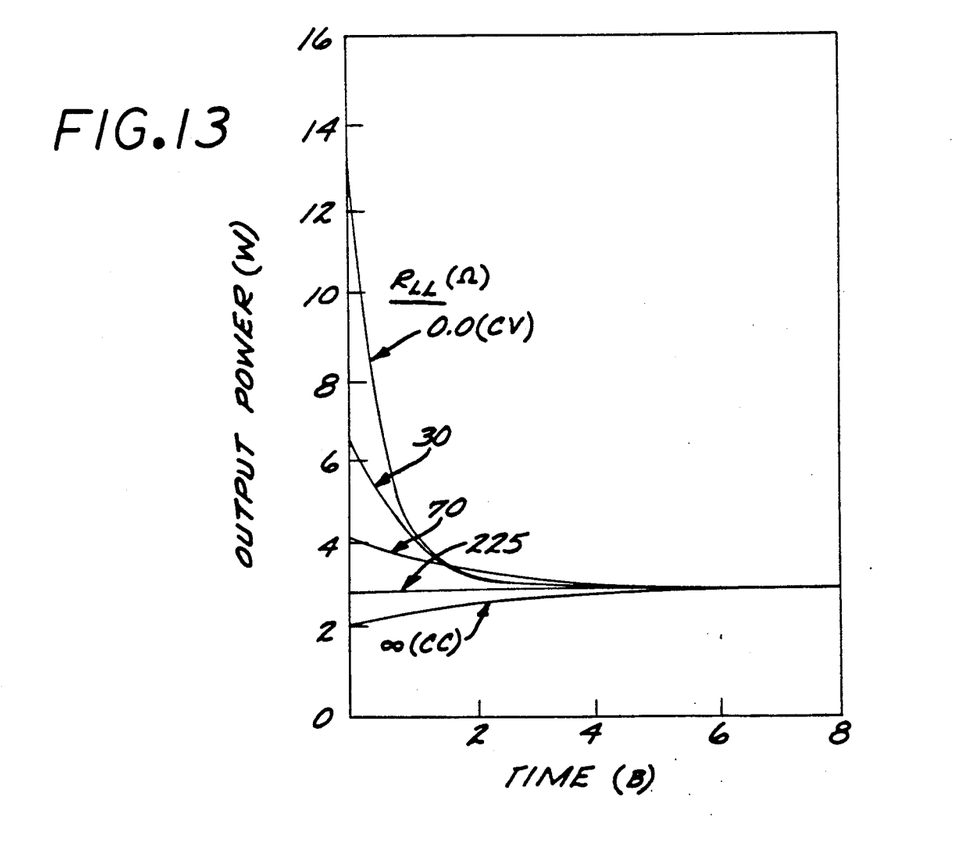
FIG. 13 is a graph illustrating the cold start transient operation of a diode biased with respective constant current, constant voltage and various loadline biasing.

Knowing the temperature provides sufficient information to determine the RF output power over time. FIG. 13 provides an illustration for cold start transient operation. In this figure, the RF power as calculated from Equations 10-12 for a diode in CW operation is plotted versus time for varying $R_{LL}$ values, from zero (CV biasing) to infinity (CC biasing). The time constant of the curves is proportional to the loadline value. Low value loadlines start at high power and drop down with time, whereas high value loadlines start with low power and build up with time. In the illustrated example, the RF output immediately rises to full power at the intermediate value of 225 ohms and remains there. The ease in achieving this characteristic with IMPATT diodes is considered remarkable, and is particularly useful in applications in which full power is required at turn on with cold temperatures.

The relatively high value of $R_{LL}$ (225 ohms) calculated in this example as compared to the previous examples (10-25 ohms) results from the CW operation of the diode in which the bias current is relatively low, rather than the pulsed operation of the examples considered previously, in which the bias current is relatively high. To use a pulsed diode for a thermal example would require a much more complex thermal model, with multiple time constants rather than a simple R-C time constant.

Figure 14:
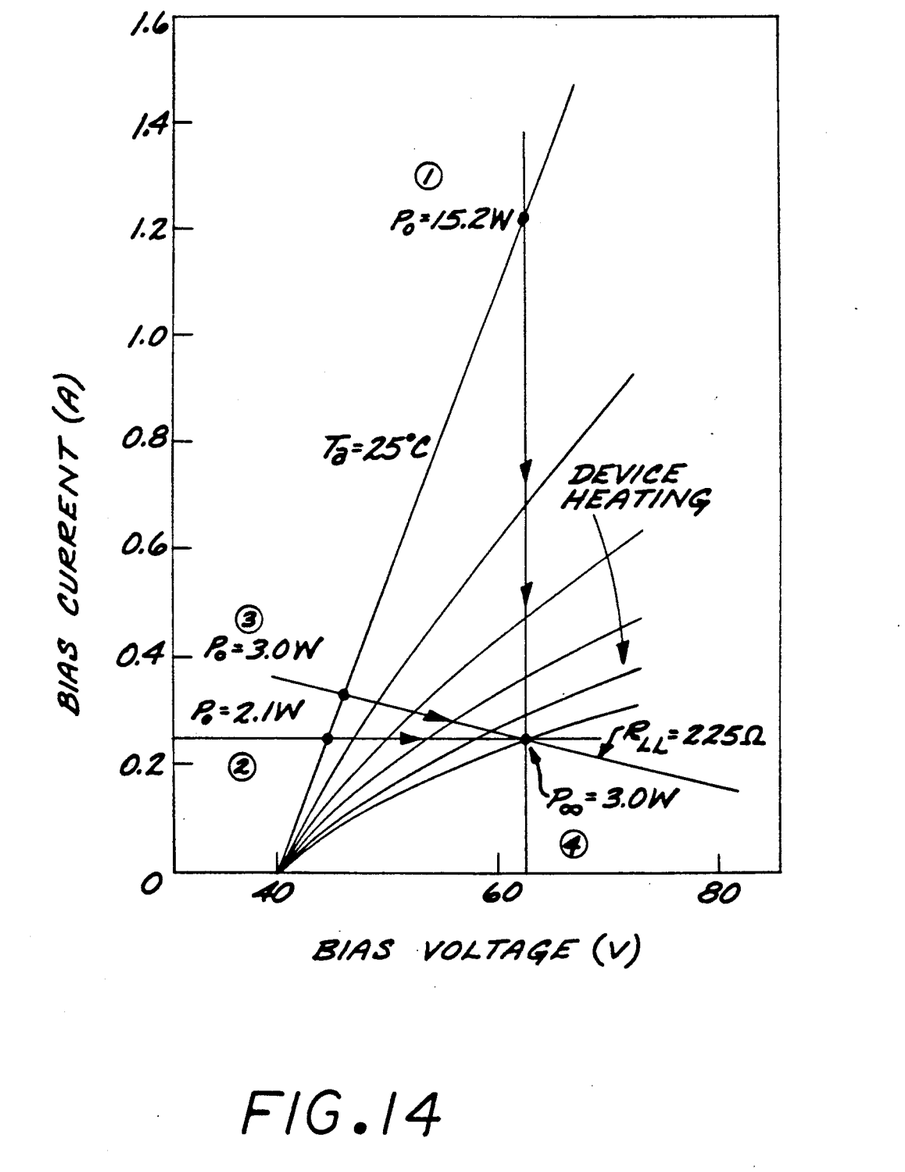
FIG. 14 is a graph plotting the bias voltage and bias current for constant current, constant voltage and loadline biasing conditions to illustrate bias operation during turn-on transients.

The cold start transient operation is further illustrated in the current-voltage plot of FIG. 14. Points 1, 2 and 3 represent, respectively, the starting or turn on bias points for CV, CC or loadline $R_{LL}$ operation. These points exist on the same bias line at the initial temperature ($T_A = 25°$ C.). Upon turn on, the bias points move along the bias lines (as indicated by the arrows) to the steady state point 4. Their movement is dictated by the shift of the device curves (shown sequentially as the device heats up). Since point 1 is at a very high power level, device heating occurs much more rapidly than for point 2, resulting in a much shorter decay or transient time. This difference is shown in FIG. 13.

Figure 15:
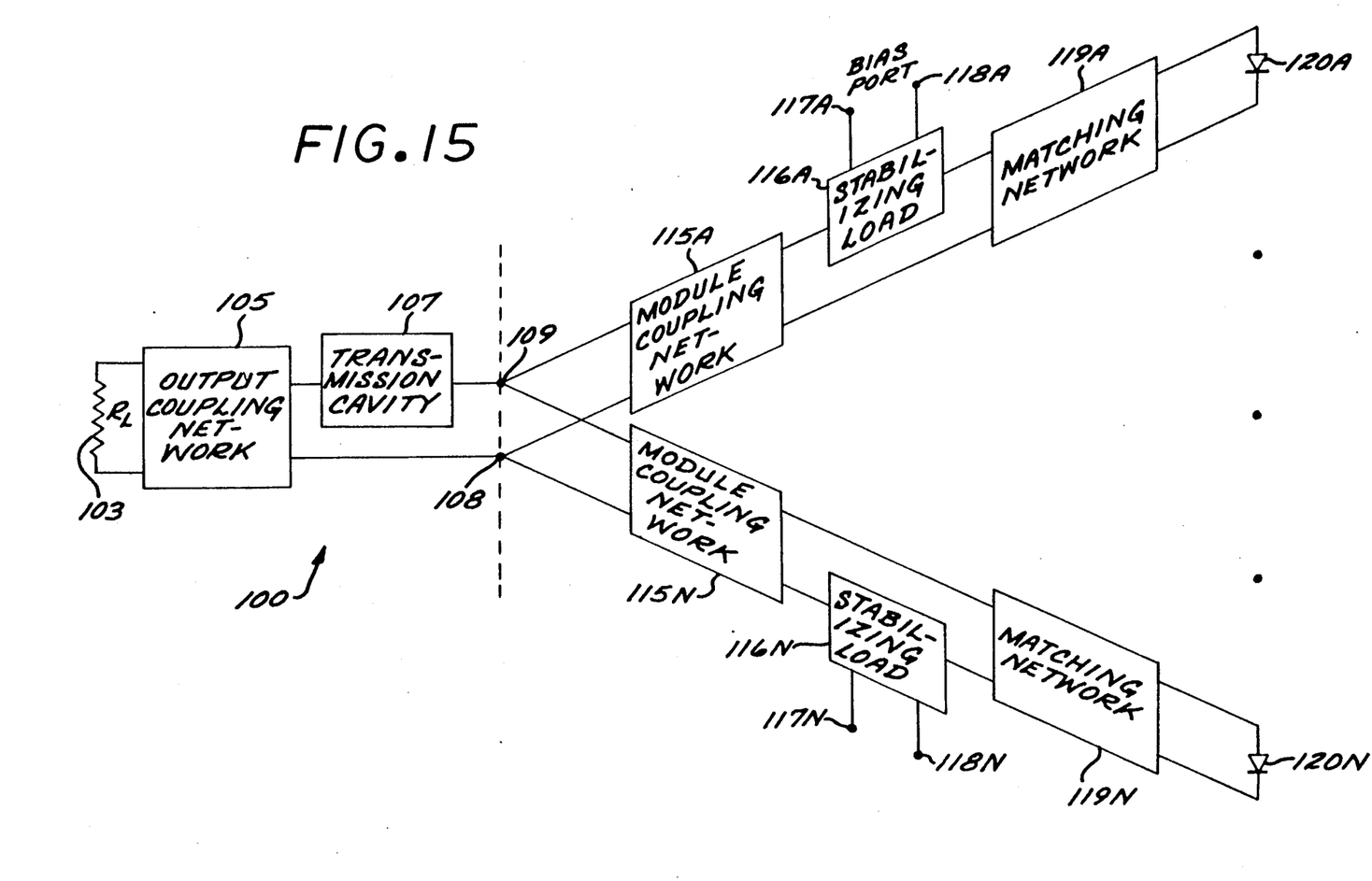
FIG. 15 is a functional block diagram of an N diode combiner circuit for which loadline biasing may be employed.

Referring now to FIG. 15, a functional block diagram of an N diode RF power combiner circuit 100 is disclosed. The loadline biasing technique described herein may be advantageously employed with such combiner circuits. N IMPATT circuit modules are combined at combiner nodes 108 and 109. The rf power developed by the N circuit modules combined at nodes 108 and 109 is coupled to the output load 103 through transmission cavity 107 and output coupling network 105, in a manner which is well known to those skilled in the art.

Each IMPATT circuit module comprises a module coupling network 115n, a stablizing load 116n to which the module loadline bias circuit is connected at bias port terminals 117n, 118n. The IMPATT diode 120n is coupled to the stablizing load 116n through a matching network 119n.

A loadline bias circuit such as is depicted in FIG. 3(a) or FIG. 3(b) is connected to each circuit module at the bias port terminals 117n, 118n.

Use of the optimum loadline biasing is understood to result in maximum usable injection locking bandwidth for multiple diode power combiners, as compared to combiners employing CC or CV biasing. The usable bandwidth is determined by the overlap between the upper frequency end of the RF output power versus frequency characteristic for the high temperature case, and the low frequency end of this characteristic for the low temperature case, for the same power requirement. In the case of CV biasing, the RF output power and frequency decrease with increasing temperature. CC biasing affects the RF power differently; as the temperature increases, the average RF power increases and the frequency decreases. With loadline biasing, the frequency shifts less with increased temperature, while the RF output power is relatively constant, resulting in increased usable bandwidth.

There has been described a loadline bias technique for biasing solid state power devices. Loadline biasing in accordance with the invention has the advantages of increased power, reduced temperature sensitivity, elimination of thermal runaway and faster turn on (cold start) characteristics. Moreover, RF combiner performance is less sensitive to diode mismatch, the biasing electronics are simpler and more cost effective with fewer parts.

I claim:

1. A bias circuit for supplying bias power to a solid state power device for generating output energy at RF frequencies, comprising:
   a power supply; and
   a resistive element coupled to said power supply, said resistive element having a value selected to provide a predetermined bias loadline which causes said solid state device to generate constant output power.

2. The bias circuit of claim 1 wherein said predetermined bias loadline is tangent to a constant power curve passing through the device operating point.

3. The bias circuit of claim 1 wherein said power supply comprises a current source supply for supplying a constant current, and said resistive element is coupled in parallel connection to said current source supply so that said impedance of the bias circuit is established by said resistive element.

4. The bias circuit of claim 1 wherein said power supply comprises a voltage source supply for supplying a constant voltage, and said resistive element is coupled in series connection to said voltage source supply so that the impedance of said bias circuit is established by said resistive element.

5. A bias circuit for an IMPATT diode for generating output energy at RF frequencies, comprising:
   a bias power supply; and
   passive impedance means coupled to said power supply; said passive impedance means having a value selected to provide a predetermined bias loadline which causes said IMPATT diode to generate substantially constant output power, said output power exhibiting reduced sensitivity to limited changes in the device operation point as compared to constant current and constant voltage bias schemes.

* * * * *